United States Patent [19]
Barron et al.

[11] Patent Number: 5,926,070
[45] Date of Patent: Jul. 20, 1999

[54] EFFICIENT OFFSET MASK GENERATOR FOR PSEUDO-NOISE SEQUENCE GENERATOR

[75] Inventors: Kenneth S. Barron, Plano; Y. K. Lee, Houston; William V. Crean, Dallas, all of Tex.

[73] Assignee: Texas Instruments Incorporated, Dallas, Tex.

[21] Appl. No.: 09/034,272

[22] Filed: Mar. 4, 1998

[51] Int. Cl.$^6$ .................................................. H03K 3/84
[52] U.S. Cl. ............................................ 331/78; 364/717
[58] Field of Search ................................ 331/78; 364/717

[56] References Cited

U.S. PATENT DOCUMENTS

| | | | |
|---|---|---|---|
| 5,228,054 | 7/1993 | Rueth et al. | 375/200 |
| 5,519,736 | 5/1996 | Ishida | 331/78 |
| 5,532,695 | 7/1996 | Park et al. | 364/717 |

*Primary Examiner*—Siegfried H. Grimm
*Attorney, Agent, or Firm*—J. Dennis Moore; Richard L. Donaldson

[57] ABSTRACT

Apparatus for providing a reference pseudo-noise ("PN") sequence, and for providing a secondary PN sequence shifted with respect to the reference PN sequence by a number of chips that can be sequentially shifted. The apparatus includes a first pseudo-noise sequence generator ("PNSG"), the PNSG generating the reference PN code, having N stages, each stage being at one of two states, and having a feedback loop from the output of the PNSG, the value on the feedback loop being stored in each stage 1, 2, 3, ... N, after being multiplied by a constant associated with the stage, C1, C2, C3, ... CN, respectively, and the result added to the value in the previous stage, with "0" being deemed to be the value in the stage previous to the first stage, and then stored in the stage. Also provided is a mask generator/shifter comprising a second PNSG having N stages, wherein the N stages of the second PNSG may be loaded with a shift-and-add mask, $M=m_1, m_2, \ldots m_{N-1}, m_N$. A plurality of N logical AND steps are provided, each logical AND step being connected to multiply the states of the corresponding stage of the first PNSG and of the second PNSG. Finally, a plurality of logical XOR steps is provided, connected to add the results of all of the N logical AND steps to provide the secondary PN sequence.

1 Claim, 4 Drawing Sheets

EFFICIENT OFFSET MASK GENERATOR FOR PSEUDO-NOISE SEQUENCE GENERATOR

TECHNICAL FIELD OF THE INVENTION

This invention relates to communications, and more particularly relates to a method for quickly providing a shift-and-add offset mask for rapid pseudo-noise sequence phase offset from a reference sequence.

BACKGROUND OF THE INVENTION

Pseudo-noise ("PN") codes are finding increasing application, for example in the area of wireless telephony. In code division multiple access telephony, for example, a digitized data stream is encoded using PN codes, to "spread" the spectrum of the signal transmitting the data. The digitized data stream is decoded using the same PN code used to encode it at the transmitter.

Figure 1:
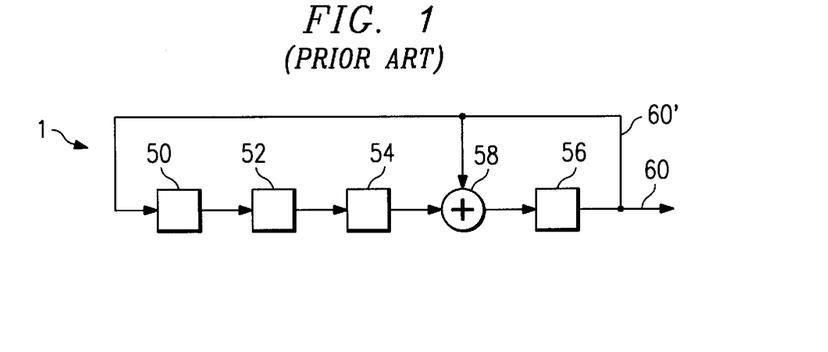
FIG. 1 is a block diagram of a prior art pseudo-noise sequence generator for pseudo-noise code sequence generation.
Figure 2:
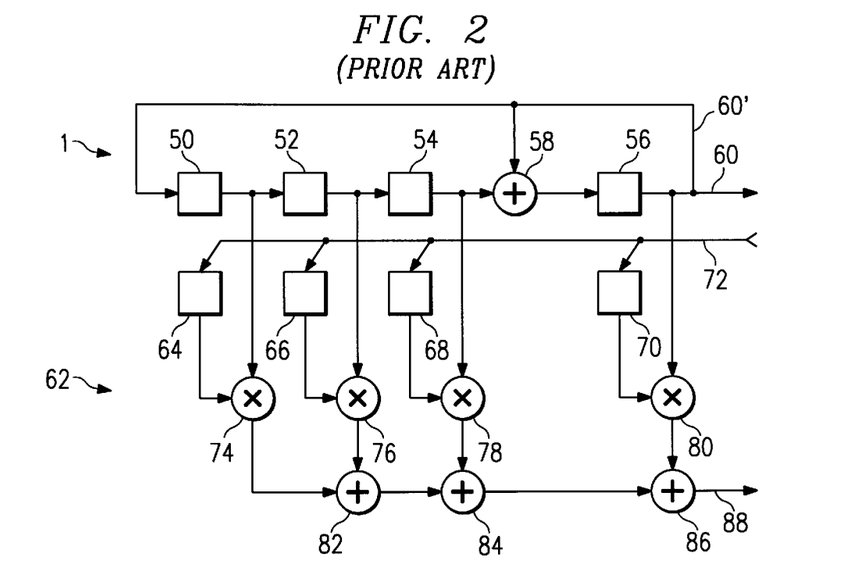
FIG. 2 is a prior art pseudo-noise sequence generator having an associated delay element.

PN codes are generated by pseudo-noise sequence generators ("PNSGs"). One familiar apparatus used in PNSGs is a device known as a linear feedback shift register ("LFSR"). However, PNSGs are not limited to LFSRs. An PNSG is typically composed of a series of N stages, each stage including a memory stage or memory step, depending on whether the PNSG is hardware (e.g., an LFSR) or software, whose inputs are a linear combination (modulo 2) of the PNSG itself and of the previous memory stage or step when viewed from a left-to-right perspective. The individual ones and zeros ("bits") of the output sequence of a PNSG, which is the PN code, are sometimes referred to as "chips." A specific example of a PNSG 1 for N=4 is shown in FIG. 1. It will be understood that the PNSG 1 may be implemented in hardware, in which case FIG. 1 represents an LFSR, or it may be implemented in software, for example for execution on a DSP, in which case FIG. 2 represents a structure for the logical flow of the method so implemented. While discussion is in terms of such method, i.e., with "steps" instead of "stages" it will be understood that selection of hardware or software for implementation is well within the design choices of which the routineer in the art is capable, once the principles of the present invention described herein are understood. In general, hardware is to be preferred, because of its speed. However, full or partial implementation in software may be desirable for other considerations, such as cost.

In FIG. 1 can be seen the four memory steps 50, 52, 54, 56, as well as a logical XOR step 58 disposed between memory steps 54 and 56. Logical XOR steps implement a modulo-2 addition. The output of memory step 50 is provided to the input of memory step 52, the output of memory step 52 is provided to the input of memory step 54, while the output of memory step 54 is provided to one input of logical XOR step 58. The output of logical XOR step 58 is provided to the input of memory step 56, with the output 60 of the PNSG being the output 60 of memory step 56. A feedback path 60' is also provided from the output 60 of memory step 56 to the input of memory step 50 and to the other input of logical XOR step 58.

The operation of the PNSG 1 shown in FIG. 1 can be described by either a state diagram or a table. The "state" of the PNSG 1 is the value of the bits stored in the memory steps before a given iteration. Thus, for PNSG 1, the state before iteration "n" may be expressed as $S_n$=pqrs, where p, q, r and s are the values of the bits stored in memory steps 56, 54, 52, 50, respectively. If the memory steps 56, 54, 52, 50, of PNSG 1 are initialized with the state $S_0$=1000, the output and subsequent states of the PNSG are as shown in Table 1:

TABLE 1

| Clock Cycle or Iteration | State | Output |
|---|---|---|
| 0 | 1000 | 1 |
| 1 | 1001 | 1 |
| 2 | 1011 | 1 |
| 3 | 1111 | 1 |
| 4 | 0111 | 0 |
| 5 | 1110 | 1 |
| 6 | 0101 | 0 |
| 7 | 1010 | 1 |
| 8 | 1101 | 1 |
| 9 | 0011 | 0 |
| 10 | 0110 | 0 |
| 11 | 1100 | 1 |
| 12 | 0001 | 0 |
| 13 | 0010 | 0 |
| 14 | 0100 | 0 |
| 15 | 1000 | 1 |

With respect to Table 1, note that after the 15th iteration the state of the PNSG reaches that of the initial or 0th iteration. In fact, the output and state sequences of the PNSG repeat with a period of 15. For the case of N=4, this represents the maximum possible period since the all zeros state never occurs. Thus, in general, a PNSG is capable of generating a sequence of period (or, length) $2^N-1$, where N is the number of steps. Not all PNSG configurations generate a sequence with the largest possible period, but those that do are said to generate a maximal length sequence or "m-sequence" for short. For the purposes of the present invention, PNSGs that generate m-sequences are of primary interest and hence discussion herein is focused on PNSGs having this property.

Now, it is often desirable to generate a delayed version of a PN code relative to some master, or reference, sequence. While it is possible to use a simple delay line to accomplish this, it is frequently necessary to generate very long delays that cause this approach to become impractical.

A superior technique for generating a delayed PN code exploits the shift-and-add property of m-sequences. This property is that when a shifted or delayed version of a PN code is added to itself, the resulting code is merely a delayed version of the original. To better understand this, consider the following sequence generated by the PNSG 1 of FIG. 1:
. . . 1111010110010000 . . . .
If this sequence is shifted or delayed by one chip, the result is
. . . 011110101100100 . . . .
Adding these two sequences together using modulo 2 arithmetic yields
. . . 100011110101100 . . . ,
which is merely the original PN sequence delayed by 4 chips. While other specific delays can be generated in this fashion, a more efficient and sophisticated method is described next.

Referring to the State column in Table 1, note that the sequence associated with a particular stage represents a shifted version of the PNSG output. E.g., the sequence corresponding to the least significant bit of the state vector is identical to the output; the sequence corresponding to the most significant bit is the output shifted by one chip, etc. Thus according to the shift-and add property of m-sequences, another PN code having a specific shift relative to the original sequence can be generated by adding together one or more outputs of the four stages. If the PN code is being provided serially in time, then that shift represents a delay.

FIG. 2 shows a PN sequence generator similar to the arrangement of FIG. 1, including a PNSG 1 like that of FIG. 1, but, unlike the arrangement of FIG. 1, also having an associated delay element 62. As in FIG. 1, four memory steps 50, 52, 54, 56, a logical XOR step 58, an output 60 and a feedback path 60' are provided, interconnected as in FIG. 1. Also provided, however, is delay element 62. The delay element 62 is comprised of an additional four memory steps 64, 66, 68, and 70, and associated logical AND and logical XOR steps, as explained below. The memory steps 64, 66, 68, and 70, receive a PN shift-and-add mask value over an input 72. The output of memory step 64 is provided to one input of a first logical AND step 74. Logical AND steps perform a modulo-2 multiplication. The other input of logical AND step 74 is the output of memory step 50. The output of memory step 66 is provided to one input of a second logical AND step 76. The other input of logical AND step 76 is the output of memory step 52. The output of memory step 68 is provided to one input of a third logical AND step 78. The other input of logical AND step 78 is the output of memory step 54. The output of memory step 70 is provided to one input of a fourth logical AND step 80. The other input of logical AND step 80 is the output of memory step 56.

The output of logical AND step 74 is provided to one input of a second logical XOR step 82. The output of logical AND step 76 is provided to the second input of logical XOR step 82, while the output of logical XOR step 82 is provided to one input of a third logical XOR step 84. The output of logical AND step 78 is provided to the second input of logical XOR step 84, while the output of logical XOR step 84 is provided to one input of a fourth logical XOR step 86. The output of logical AND step 80 is provided to the second input of logical XOR step 86. The output 88 of logical XOR step 86 provides the same sequence as the output 60 of the PNSG 1, but delayed by an amount determined by the value of the shift-and-add mask stored in memory steps 64, 66, 68, and 70.

Thus, by forming the inner product of a shift-and-add mask, hereinafter simply referred to as a "mask," stored in the memory steps 64, 66, 68, 70, with the states of the PNSG, stored in the memory steps 50, 52, 54, 56, as shown in FIG. 1, a second sequence can be generated with a known delay relative to the PNSG output. This second sequence is, as mentioned above, provided at the output 88 of logical XOR step 86.

However, a problem that exists in the practical application of the use of a mask for accomplishing rapid shifts of PN sequences is in the time it takes to generate the mask itself. For example, PN sequence generators are currently being used in code division multiple access ("CDMA") cellular telephone applications. Rapid shifts in the PN sequences generated in such applications are desirable for despreading a desired PN delay. Therefore, there is a need for a method and apparatus for generating a mask rapidly, yet controllably and accurately.

SUMMARY OF THE INVENTION

The present invention provides an apparatus for generating a reference pseudo-noise ("PN") sequence, and for generating a secondary PN sequence shifted with respect to the reference PN sequence by a number of chips that can be sequentially determined. The apparatus includes a first pseudo-noise sequence generator ("PNSG"), the PNSG generating the reference PN code, having N stages, each stage being at one of two states, and having a feedback loop from the output of the PNSG, the value of the feedback loop being stored in each stage 1, 2, 3, . . . N, after being multiplied by a constant associated with the stage, C1, C2, C3 . . . CN, respectively, and the result added to the value in the previous stage, with "0" being deemed to be the value in the stage previous to the first stage, and then stored in the stage. Also provided is a mask generator/shifter comprising a second PNSG having N stages, wherein the N stages of the second PNSG may be loaded with a shift-and-add mask, $M=m_1, m_2, \ldots, m_{N-1}, m_N$. A plurality of N logical AND steps are provided, each logical AND step being connected to multiply the states of the corresponding stage of the first PNSG and of the second PNSG. Finally, a plurality of logical XOR steps is provided, connected to add the results of all of the N logical AND steps to provide the secondary PN sequence.

These and other features of the invention that will be apparent to those skilled in the art from the following detailed description of the invention, taken together with the accompanying drawings.

DETAILED DESCRIPTION OF THE PREFERRED EMBODIMENT

Figure 3:
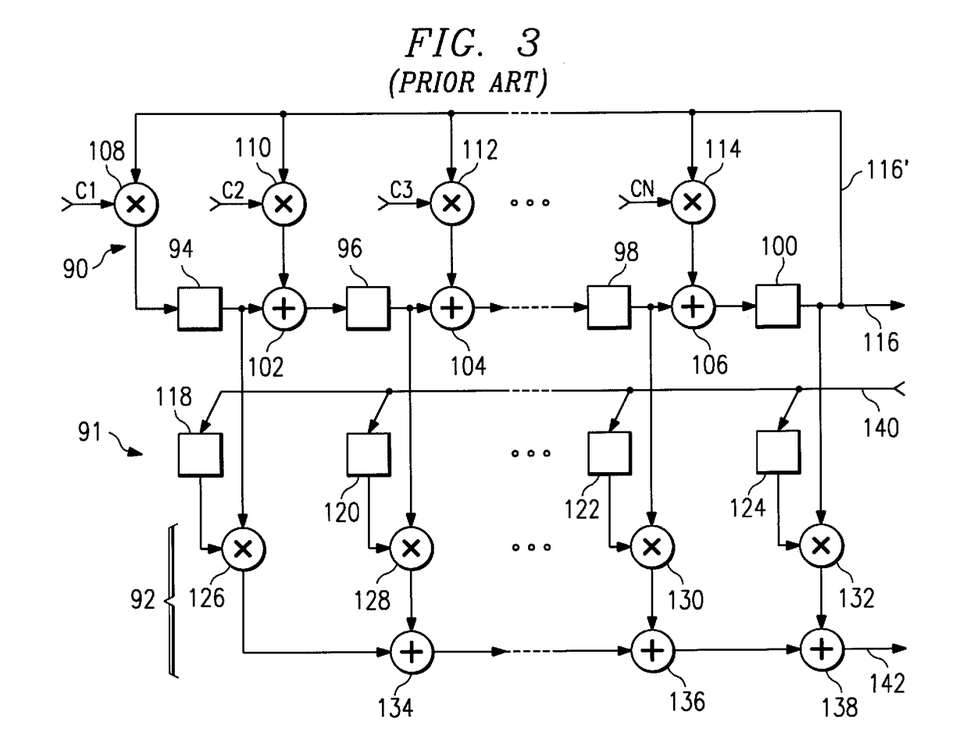
FIG. 3 is a generalized pseudo-noise sequence generator with associated delay element.

FIG. 3 shows a generalized prior art PNSG 90 with an associated delay element 92. Understanding its operation is useful as background for an understanding of the preferred embodiment of the present invention.

The PNSG 90 includes memory steps 94, 96, . . . , 98, 100, for storing PN values $x_1, x_2, \ldots, x_{N-1}, x_N$, respectively. Also provided are logical XOR steps 102, 104, . . . , 106, and logical AND steps 108, 110, 112, . . . , 114, as shown. The output of logical AND step 108 is provided to the input of memory step 94. The output of memory step 94 is provided to one input of logical XOR step 102, while the output of logical AND step 110 is provided to the second input of logical XOR step 102. The output of logical XOR step 102 is provided to the input of memory step 96. The output of memory step 96 is provided to one input of logical XOR step 104, while the output of logical AND step 112 is provided to the other input of logical XOR step 104, and so on, as shown, with the output end of PNSG 90 being interconnected such that the output of memory step 98 (having received as input the output of the previous stage's logical XOR step) is provided to one input of logical XOR step 106, while the output of logical AND step 114 is provided to the second input of logical XOR step 106. The output of logical XOR step 106 is provided to the input of memory step 100.

The output 116 of memory step 100 is the output of the PNSG 90, which is the reference PN sequence output.

Constant C1 is provided to one input of logical AND step 108. Constant C2 is provided to one input of logical AND step 110. Constant C3 is provided to one input of logical AND step 112, and so on, as shown, while constant CN is provided to one input of logical AND step 114. The output 116 of memory step 100 is provided to the other input to each of logical AND steps 108, 110, 112, . . . , 114, via feedback path 116'.

The delay element 91, 92 is comprised of a series 91 of memory steps 118, 120, . . . , 122, 124, for storing mask values $m_1, m_2, \ldots, n_{N-1}, m_N$, respectively, and a group 92 of logical AND steps 126, 128, . . . , 130, 132, and logical XOR steps 134, . . . , 136, 138.

Memory steps 118, 120, . . . , 122, 124, receive mask values $m_1, m_2, \ldots, m_{N-1}, m_N$, respectively, over line 140. The output of memory step 118 is provided to one input of logical AND step 126. The output of memory step 94 is provided to the other input of logical AND step 126, while the output of logical AND step 126 is provided to one input of logical XOR step 134. The output of memory step 96 is provided to one input of logical AND step 128. The output of memory step 120 is provided to the other input of logical AND step 128, while the output of logical AND step 128 is provided to the other input of logical XOR step 134, and so on, as shown, with the output end of delay element 91, 92, being interconnected such that the output of memory step 122 is provided to one input of logical AND step 130, with the output of memory step 98 being provided to the other input of logical AND step 130, while the output of logical AND step 130 is provided to one input of logical XOR step 136. The other input of logical XOR step 136 is provided from the previous stage's logical XOR step. The output of logical XOR step 136 is provided to one input of logical XOR step 138. The output of memory step 100 is provided to one input of logical AND step 132. The output of memory step 124 is provided to the other input of logical AND step 132, while the output of logical AND step 132 is provided to the other input of logical XOR step 138. The output 142 of delay element 91, 92, provides the same sequence as the output 116 of the PNSG 90, but delayed by an amount determined by the value of the shift-and-add mask stored in memory steps 118, 120, . . . , 122, and 124.

It will now be shown, in accordance with the preferred embodiment of the present invention, how to provide rapidly a sequential sequence of masks, Mp, Mp+1, Mp+2, . . . etc., wherein Mp=$m_{1p}, m_{2p}, \ldots m_{N-1p}, m_{Np}$, for memory stages of a PNSG, so as to provide rapidly an output that is a series of PN sequences, each shifted by a desired amount as compared with a reference PN sequence provided as the primary output of the PNSG 90.

For the general PNSG 90 and delay element 92 shown in FIG. 3, the state outputs may be expressed as a function of the PNSG output, y(n)=$x_N$(n), and connection taps (C1, C2, . . . CN):

$$x_1(n) = C1 y(n-1) \qquad (1)$$
$$x_2(n) = C2 y(n-1) + x_1(n-1)$$
$$\vdots$$
$$x_N(n) = CN y(n-1) + x_{N-1}(n-1)$$

The delayed output, y(n−K), may be expressed as:

$$y(n-K) = m_1 x_1(n) + m_2 x_2(n) + \ldots + m_N x_N(n) = \sum_{i=1}^{N} m_i x_i(n) \qquad (2)$$

In Equation (2), K is the desired delay value, expressed as a number of chips.

Now, according to the prior art, every time a different delay is desired, a new mask must be generated and then stored in the holding stages, i.e., memory steps 118, 120, . . . 122, 124, via line 140. Typically, this is done in a microprocessor, such as a DSP. In the practical example of CDMA searching, it may be necessary to determine, generate, and store new delays at such a high rate that it places excessive demands on the processing capability of the microprocessor.

The instant invention takes advantage of the fact that in some circumstances, such as CDMA searching, it may be desirable to generate a new delay, from a current delay, that differs by only one chip from the current delay, i.e., sequentially. The preferred embodiment of the present invention is provided in FIG. 4, to generate and store such sequential masks quickly and efficiently in such situations.

Figure 4:
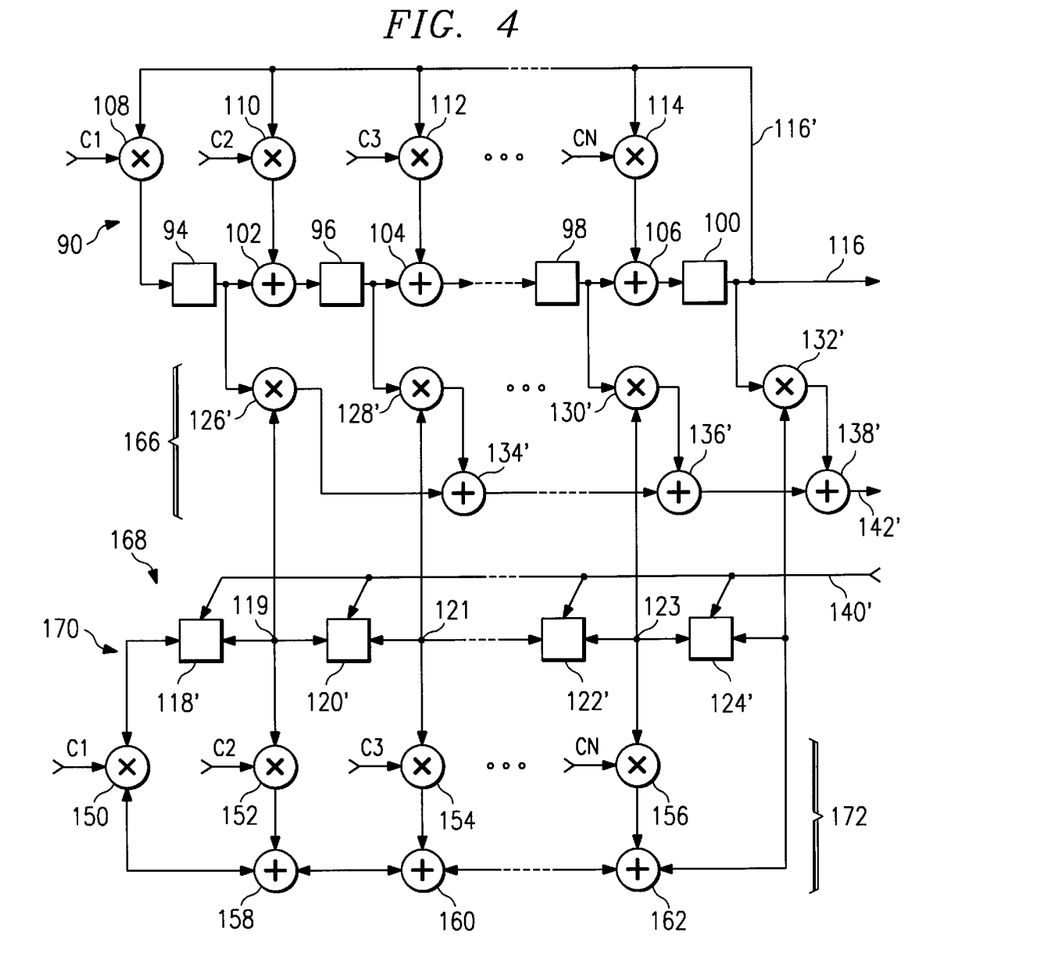
FIG. 4 is a generalized pseudo-noise sequence generator with associated mask generator/shifter according to the preferred embodiment of the present invention.

In FIG. 4, a generalized PNSG 90, plus an associated mask generator/shifter 166, 168, configured in accordance with the principles of the present invention, are provided. The PNSG 90 is configured essentially the same as that of FIG. 3, with the output line 116 providing the primary PN code, y(n). The mask generator/shifter 166, 168, includes some similar steps to those in the delay element 92 of FIG. 3. Thus, in mask generator/shifter 166, 168, there are provided a group 166 of logical AND steps 126', 128', . . . , 130', 132', and logical XOR steps 134', . . . , 136', 138', corresponding to the group 92 of multiply steps 126, 128, . . . , 130, 132, and logical XOR steps 134, . . . , 136, 138, of FIG. 3, respectively. Also provided in mask generator/shifter 166, 168 is a second PNSG 168 that includes a series 170 of memory steps 118', 120', . . . , 122', 124', corresponding to the series 91 of memory steps 118, 120, . . . , 122, 124, of FIG. 3, respectively.

However, in addition, the second PNSG 168 also includes a second group 172 of logical AND steps 150, 152, . . . , 154, 156, and logical XOR steps 158, . . . , 160, 162, that operate with the series 170 of memory steps, to perform the function of a PNSG additional to PNSG 90.

The mask values in the series 170 of memory steps are combined in the group 166 of logical AND steps 126', 128', . . . , 130', 132', and logical XOR steps 134', . . . , 136', 138', with the PN values $x_1, x_2, \ldots, x_{N-1}, x_N$, stored in memory steps 94, 96, . . . , 98, 100, in a manner similar to that of FIG. 3.

In this way, the mask values $m_1, m_2, \ldots, m_{N-1}, m_N$, stored in the series 170 of memory steps 118', 120', . . . , 122', 124', respectively, can be operated on by operation of the second PNSG 168 so as to change those mask values in order to achieve, for example, a sequentially shifting delayed output, y(n−K), without having to keep re-calculating new mask values elsewhere and re-loading them in the series 170 of memory steps each time a new mask is desired.

Note that the series 170 of memory steps are arranged for bi-directional shifting, and the group 172 of logical AND steps and logical XOR steps are also configured so as to allow for bidirectional re-calculation of the mask values $m_1, m_2, \ldots, m_{N-1}, m_N$, in the series 170 of memory steps. Thus, logical AND step 150 is a bi-directional step, as are logical XOR steps 158, . . . , 160, 162. These innovations for bi-directional re-calculation are described in detail below.

Connections and operation of the components shown in FIG. 5 will now be described, other than the interconnections of the PNSG 90 which are the same as those of PNSG 90 of FIG. 3. Starting with the mask generator/shifter 168, in a manner similar to FIG. 3, memory steps 118', 120', ..., 122', 124', receive mask values $m_1, m_2, \ldots, m_{N-1}, m_N$, over line 140'. Logical AND step 150 receives as one input the constant C1, and provides its output to the left ("left" and "right" herein are all as viewed in FIG. 4) shift input/output of memory step 118' or to one input of logical XOR step 158, depending upon whether the mask generator/shifter 168 is shifting left or right. If it is shifting left, the output of logical AND step 150 is provided to the input of logical XOR step 158, while if it is shifting right, the output of logical AND step 150 is provided to the shift input/output of memory step 118'.

The constant C2 is provided to one input of logical AND step 152, while the constant C3 is provided to one input of logical AND step 154, and so forth such that the constant CN is provided to one input of logical AND step 156.

The interconnection node 119 for the right shift input/output of memory step 118' and the left shift input/output of memory element 120' is connected also to the other input of logical AND step 152 and to one input of logical AND step 126'. The interconnection node 121 for the right shift input/output of memory step 120' and the left shift input/output of the next memory element (not shown) in the series 170 of memory elements 118', 120', ..., 122', 124', is provided to the other input of logical AND step 154 and to one input of logical AND step 128', and so forth such that the interconnection node 123 for the right shift input/output of the second-to-last memory step 122' and the last memory element 124' is connected also to the other input of logical AND step 156 and to one input of logical AND step 130'. The right shift input/output of the last memory step 124' is connected to the right input/output of logical XOR step 162 and to an input of logical AND step 132'.

The output of logical AND step 156 is provided to an input of logical XOR step 162. Logical XOR step 162 is at one end of a chain of logical XOR steps, as shown in FIG. 4, such that, in a left-shift operation of the mask generator/shifter 168, the output (/input) of logical XOR step 162 is provided to an input (/output) of the second-to-last logical XOR step (not shown) in the chain, the other input (/output) of such second-to-last logical XOR step being provided by the output (/input) of the logical AND step (not shown) in the chain of logical AND step steps 150, 152, 154, ..., 156, that receives the constant CN-1, and so forth, such that the third logical XOR step (not shown) in the chain of logical XOR steps 158, 160, ..., 162, is provided as an input (/output) to logical XOR step 160, with the output of logical AND step 154 being provided to the other input (/output) of logical XOR step 160. The output (/input) of logical XOR step 160 is provided to one input (/output) of logical XOR step 158 with the output of logical AND step 152 being provided to the other input (/output) of logical XOR step 158. Finally, the output (/input) of logical XOR step 158 is provided to the other input (/output) of logical AND step 150. In a right-shift operation, the logical XORs performed in logical XOR steps 158, 160, ..., 162, are done in the reverse direction as that for a left-shift operation.

Now, the output of memory step 94, in addition to being provided to the input of logical XOR step 102, is provided to the other input of logical AND step 126'. The output of logical AND step 126' is provided to one input of logical XOR step 134'. Likewise, the output of memory step 96, is, in addition to being provided to the input of logical XOR step 104, provided to the other input of logical AND step 128', with the output of logical AND step 128' being provided to the other input of logical XOR step 134'. The output of logical XOR step 134' is provided to an input of the next logical XOR step (not shown) in the chain of logical XOR steps 134', ..., 136', 138', with the other input to such next logical XOR step being provided from the next logical AND step (not shown) in the chain of logical AND steps 126', 128', ..., 130', 132'. And so forth, such that the output of memory step 98, is, in addition to being provided to the input of logical XOR step 106, provided to the other input of logical AND step 130', with the output of logical AND step 130' being provided to an input of logical XOR step 136', with logical XOR step 136' receiving its other input from the next previous logical XOR step (not shown) in the chain of logical XOR steps 134', ..., 136', 138'. The output of logical XOR step 136' is provided to an input of logical XOR step 138'. The output of memory step 100, is, in addition to being provided as the output 116 of the PNSG 90, provided to the other input of logical AND step 132'. The output of logical AND step 132' is provided to the other input of logical XOR step 138'. The output of logical XOR step 138' is line 142', which provides the delayed PN code, y(n−K).

The circuit of FIG. 4 operates as follows. The PNSG 90 operates as described above, generating the primary, or reference, PN code, which is output on line 116. The PN mask bit values, $m_1, m_2, \ldots, m_{N-1}, m_N$, are initially loaded into the memory steps 118', 120', ..., 122', 124', on respective load inputs, over line 140', as mentioned above. The inner product of the PN code and the PN mask is obtained as individual states of the current PN code, stored in memory steps 94, 96, ..., 98, 100, are operated on along with the PN mask bit values, $m_1, m_2, \ldots, m_{N-1}, m_N$, by the group 166 of logical AND steps 126', 128', 130', 132', and logical XOR steps 134', ..., 136', 138'. This results in the generation of a secondary sequence provided on line 142' that has delay K relative to the reference sequence provided on line 116.

To increase the delay K by one chip, i.e., to obtain a secondary sequence having delay K+1, the second PNSG 168 is operated so as to shift the mask bit values from left to right, with the new value of $m_1$ given by $$m_1 = C1\left[m_N + \sum_{i=0}^{N-2} C(N-i)m_{N-1-i}\right]$$

where all mathematical operations are modulo 2, and the calculation is performed prior to the shift. Note that C1 is always 1 for a maximal-length sequence.

To decrease the delay by one chip, i.e., to obtain a secondary sequence having delay K−1, the second PNSG 168 is operated so as to shift the mask bit values from right to left, with the new value of $m_N$ given by $$m_N = \sum_{i=1}^{N} Cim_i$$

where all mathematical operations are again modulo 2, and the calculation is performed prior to the shift, as before.

These operations are easily implemented in hardware with digital logic and can be carried out in one clock cycle to obtain a new delay or advance of one chip of the secondary PN sequence.

The mask generator/shifter 166, 168 provides, in effect, the function of a PNSG so as to generate sequential mask states, to operate in conjunction with the states of the PNSG 90 and thereby provide a shifted pseudo-noise sequence output on line 142', that can have its offset shifted incrementally simply by the clocking thereof.

The principles of the present invention may be applied to PNSGs of various sorts. For example, the present invention may be incorporated into a PNSG that is modified to provide a sequence period of $2^N$, rather than $2^N-1$, as has been described above. FIGS. 5 and 6 show modifications to the PNSG 90, and associated mask generator/shifter 166, 168, of FIG. 4 that make it a PNSG having a $2^N$ period.

Figure 5:
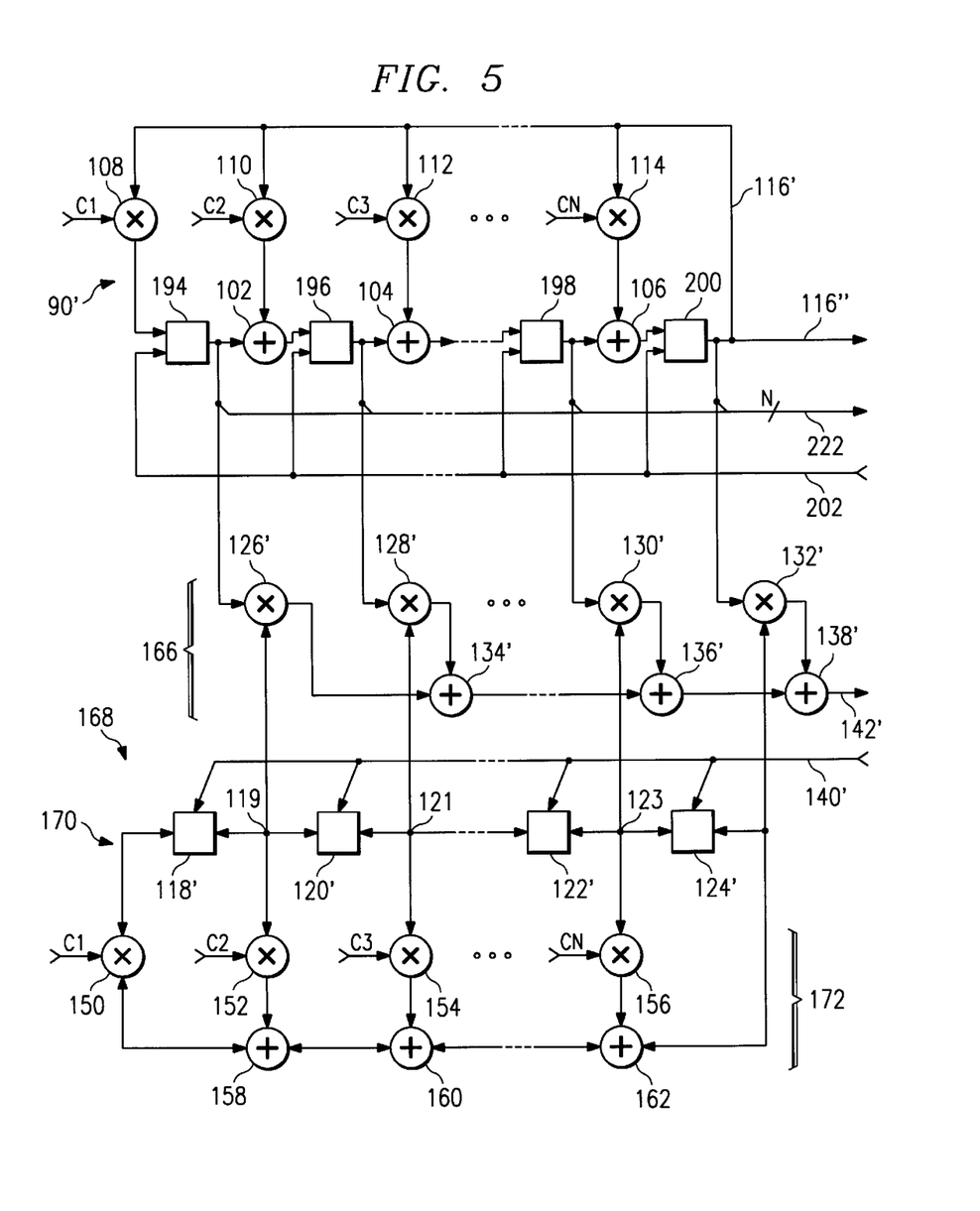
FIG. 5 is a diagram of an arrangement that is similar to the arrangement in FIG. 4, but in which the PNSG 90' is a modified version of the PNSG 90 of FIG. 4.
Figure 6:
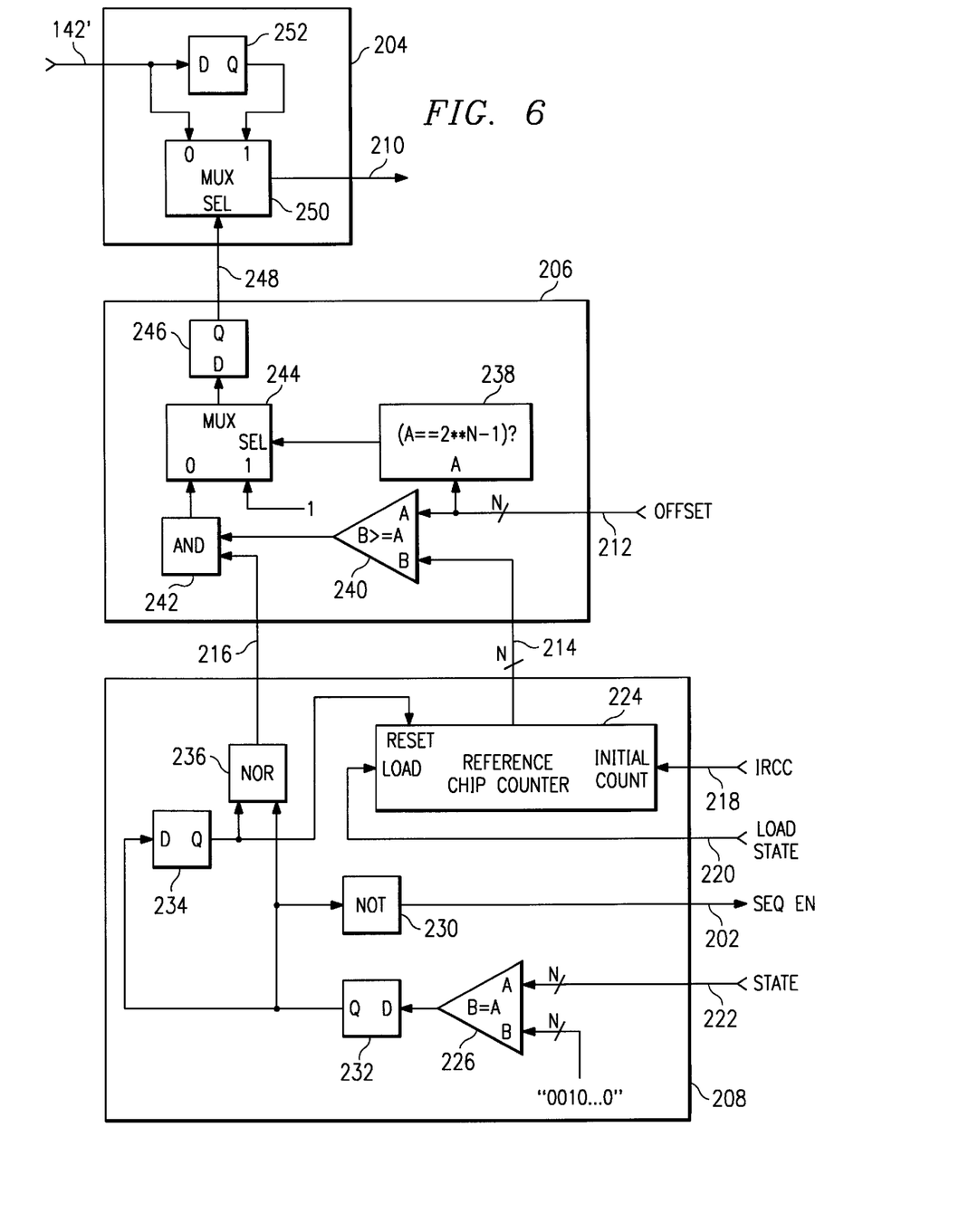
FIG. 6 is a diagram of a zero-insertion controller for the PNSG 90' and for the mask generator 168, of FIG. 5.

FIG. 5 is a diagram of an arrangement that is similar to the arrangement in FIG. 4, but modified in accordance with the principles of the present invention. Specifically, the PNSG 90' in FIG. 5 is a modified version of the PNSG 90 of FIG. 4 in that the memory steps 94, 96, ..., 98, 100, have been replaced by gated memory steps 194, 196, ..., 198, 200, being gated by a signal on input line 202, and in that the state of the PNSG 90', that is, the PN values $x_1, x_2, \ldots, x_{N-1}, x_N$, stored in the gated memory steps 194, 196, ..., 198, 200, is sensed and made available as a State signal on N-wide line 222.

The PNSG 90' of FIG. 5 operates in basically the same way as the PNSG 90 of FIG. 4. However, in the PNSG 90' operation is contingent upon an enabling signal on input line 202. Such an enabling signal is applied to the gating input of each of the gated memory steps 194, 196, ..., 198, 200, as shown, to enable them. The absence of such an enabling signal prevents the storage of new values in the gated memory steps 194, 196, ..., 198, 200, thus holding the state of the PNSG 90' at the same value for so long as the enabling signal is absent from line 202. The utilization of the State signal on line 222 is explained hereinbelow. The operation of the remainder of the arrangement of FIG. 5 is the same as that of the corresponding portions of FIG. 4.

FIG. 6 is a diagram of a zero-insertion controller for the PNSG 90' and for the mask generator 168, of FIG. 5. The zero-insertion controller of FIG. 6 operates in conjunction with the arrangement of FIG. 5 to insert for one cycle a "0" in the bit stream of the PNSG 90' output on line 116" and to insert for one cycle a "0" in the bit stream of the shifted output on line 142', at the appropriate places in each, to lengthen the sequence period of each of these streams to $2^N$.

The zero-insertion controller of FIG. 6 is comprised of a one bit shifter 204, a zero-insertion control subunit 206 for the shifted output on line 142', and a zero-insertion control subunit 208 for the PNSG 90'output on line 116".

The zero-insertion control subunit 208 receives as inputs an Initial Reference Chip Count ("IRCC") signal on line 218, a Load State signal on line 220, and the State signal on line 222, and provides the timing control output signal on line 216 to the zero-insertion control subunit 206, and a Sequence Enable ("Seq. En.") signal on line 202. The zero-insertion subunit 208 increass the period of the PNSG's state, and hence its primary output, from $2^N-1$ to $2^N$. The Seq. En. signal on line 202 is provided to the PNSG 90' shown in FIG. 5, and holds the operation of the PNSG 90' at the appropriate time, for one cycle, so as to effect the insertion of a "0" in each sequence of the PN Code output on line 116".

The one bit shifter 204 receives the shifted output on line 142' as an input, and provides on line 210 that same shifted output, but, under control of the zero-insertion control subunit 206, having a zero inserted in each sequence at the appropriate position. The zero-insertion control subunit 206 receives an Offset signal on N-bit input line 212, a Reference Chip Count ("RCC") signal on line 214, and a timing control output signal on line 216, which signals are operated on by the zero insertion control subunit 206 so as to generate the select signal on line 248, to control the one bit shifter 204 to insert at the appropriate time the zero in the shifted output on line 142', and provide the resultant output on line 210.

The details of the components of the arrangement of FIG. 6, and their operation, will now be described. The zero-insertion control subunit 208 is comprised of a Reference Chip counter 224, a first Comparator 226, an inverter (NOT circuit) 230, a first D,Q Flip-Flop 232, a second D,Q Flip-Flop 234, and a NOR gate 236. The Initial Reference Chip Count signal on line 218 is provided to an Initial Count input to the Reference Chip counter 224. The Load State signal on line 220 is provided to the "Load" input of the Reference Chip Counter 224, to trigger the loading of the IRCC signal into the counter 224. The State signal on line 222 is provided to the "A" input of first comparator 226. The "B" input of comparator 226 receives an N bit fixed value 00100 ... 0. The output of comparator 226 is provided to the "D" input of the first D,Q Flip-Flop 232. The output of the first D,Q Flip-Flop 232 is provided to the "D" input of the second D,Q Flip-Flop 234, to a first input of NOR gate 236, and to the input of inverter 230. The output of the second D,Q Flip-Flop 234 is provided to a "Reset" input of the Reference Chip counter 224, to reset the counter 224. The output of the inverter 230 is the Sequence Enable signal, which is provided on line 202.

The zero-insertion control subunit 206 for the shifted output on line 142', is comprised of a second comparator 238, a third comparator 240, an AND gate 242, a first multiplexer 244, and a third D,Q Flip-Flop 246. The Offset signal on line 212 is provided to the "A" input of the first comparator 238 and to the "A" input of the second comparator 240. Line 214, from the Reference Chip Counter 224 is provided to the "B" input of comparator 240. The output of comparator 240 is provided to a first input of AND gate 242. The output of NOR gate 236 is provided on line 216 to the second input of AND gate 242. The output of AND gate 242 is provided to the "0" input of multiplexer 244. The "1" input of multiplexer 244 is connected to a fixed value of "1". The output of comparator 238 is provided to a "Select" input of multiplexer 244. The output of multiplexer 244 is provided to the "D" input of the D,Q Flip-Flop 246.

The one bit shifter 204 is comprised of a second multiplexer 250 and a fourth D,Q Flip-Flop 252. Signal line 248 is provided to the "Select" input of multiplexer 250. Signal line 142'is provided to the "0" input of multiplexer 250, and to the "D" input of D,Q Flip-Flop 252, while the Q output of D,Q Flip-Flop 252 is provided to the "1" input of multiplexer 250. The output of multiplexer 250 is provided on line 210.

Now, in detail, the arrangement of FIGS. 5 and 6 operates as follows.

For the primary PN Code sequence, the output 202 of NOT gate 230 (FIG. 6) is normally high, thus enabling the gated memory steps 194, 196, ..., 198, 200 (FIG. 5), and thereby allowing the normal PN Code sequence generation to proceed, and the PN Code sequence to be outputted on line 116. The N-wide State signal on line 222 is provided to the "A" input of comparator 226, where it is compared against the N-wide fixed value "0010 ... 0" applied to the "B" input of comparator 226, which fixed value corresponds to a state of PNSG 90' (FIG. 5) near the end of its repeating PN Code sequence. When the "A" and "B" inputs of comparator 226 are equal, its output goes to one, setting D,Q Flip-Flop 232.

A cycle later, the Q output of D,Q Flip-Flop 232 goes high. This drives the output of NOT gate 230 low, thus de-asserting the Seq. En. signal on line 202 and disabling the gated memory steps 194, 196, ..., 198, 200 (FIG. 5). This also provides a high input to D,Q Flip-Flop 234. During the same cycle, the output of comparator 226 goes low, since the PNSG 90' proceeded one more cycle before line 202 was driven low.

A further cycle later, the Q output of D,Q Flip-Flop 232 goes low, causing the Seq. En. signal to be re-asserted on line 202, thereby allowing the normal PN Code sequence generation to proceed again. Thus, at a time determined by the N-wide fixed value "0010 ... 0" applied to the "B" input of comparator 226, a zero is inserted in every iteration of the PN Code sequence generated by the PNSG 90', making it a $2^N$ sequence. During this same cycle the Q output of D,Q Flip-Flop 234 goes high, thus resetting the Reference Chip Counter 224 and forcing line 216, the output of NOR gate 236, low during this cycle.

Now, zero insertion for the shifted output on line 142' is accomplished as follows. The function of the zero-insertion control subunit 206 is to control line 248 in the correct way. As mentioned above, it receives inputs on lines 216, 214 and 212.

Now, the desired delay is K. Line 248 has the following five Requirements. Requirements 1–3 apply for $K \geq 2$, while Requirement 4 applies for K=1 and Requirement 5 applies for K=0.

The five Requirements for line 248 are as follows. Line 248 is:
1. 0 when RCC is 0 to K−2;
2. 1 from K−1 to $2^N-2$;
3. 0 at $2^N-1$;
4. 1, always, when K=1; and
5. 0, always, when K=0.

The circuit of the zero-insertion control subunit 206 satisfies these five Requirements for line 248 in the following way.

The output of NOR 236, line 216, is 0 when RCC is $2^N-2$ and $2^N-1$. Thus, it forces the output of D,Q Flip-Flop 246, line 248, to be 0 when RCC, on line 214, is $2^N-1$ and 0, except when the Offset signal on line 212 is $2^N-1$ which occurs when K=1. This satisfies Requirement 3, and Requirement 1 when RCC=0.

When the Offset signal on line 212 equals $2^N-1$, i.e., when K=1, comparator 238 forces MUX 244 to select a 1, which maintains line 248 at 1. This satisfies Requirement 4. The role of the Offset signal on line 212 is described more fully below.

When RCC, on line 214, is K−2 to $2^N-1$, the output of comparator 240 is 1, so that the output of AND gate 242 is a 1 from K−2 to $2^N-3$. Then, as the signal on line 248 is one cycle behind the output of AND gate 242, the signal on line 248 is 1 from K−1 to $2^N-2$, so that Requirement 2 is satisfied. The converse of the foregoing must be true, so the signal on line 248 is also 0 when RCC is 0 to K−2. Thus, Requirement 1 is satisfied, as well.

When K=0, the Offset signal on line 212 is $2^N-2$, so the output of comparator 240 is 1 when RCC is $2^N-2$ and $2^N-1$, and 0 at other counts. However, the signal on line 216 is exactly 0 when RCC is $2^N-2$ and $2^N-1$, so the output of AND gate 242, and hence line 248, is always 0, which satisfies Requirement 5.

Thus, the circuit of the zero-insertion control subunit 206 satisfies all five of the aforementioned Requirements.

Note that for a desired delay, K, where $K \geq 2$, in the shifted output on line 142', a mask that causes a delay of K−1 is used. For the special cases when K=0 or 1, the mask value "10 ... 0" is used. Possible values of K are 0, 1, ..., $2^N-1$. To effect a delay of K, the value (K−2) mod $2^N$ must be used as the Offset value. For example, for a delay of 149, the value 147 must be used for the Offset. For a delay of 2, the value 0 must be used for the Offset. For a delay of 1, the value $2^N-1$ must be used for the Offset. For a delay of "0", the value $2^N-2$ must be used for the Offset.

Also note that the mask and offset values can be automatically incremented or decremented in the hardware. FIG. 5, for example, shows hardware for shifting the mask value. The Offset value can be held in a counter (not shown), and be counted up or down by 1, as indicated by an "increment" or "decrement", respectively. Such a facility saves the main processor from having to calculate the new mask values, thus increasing the efficiency of the system.

Now, when the Offset value is either $2^N-1$ or $2^N-2$, a special case for the mask occurs. This corresponds to a mask value of "10 ... 0" in both cases, as mentioned above. When the Offset value is $2^N-1$ and "decrement" is enabled, the second PNSG 168 (FIG. 5) is not clocked for one cycle. As a result, at the next clock edge, the Offset value is decreased to $2^N-2$, but the mask value remains at "10 ... 0". When the Offset value is at $2^N-2$ and "increment" is enabled, the second PNSG 168, again, must not be clocked for one cycle.

Thus, in accordance with the preferred embodiment of the present invention there is provided, as a replacement for a conventional mask generator, an additional PNSG having the same number of steps as the primary PNSG used to generate the reference, or primary, sequence. This additional PNSG can generate each clock cycle a new mask which yields a secondary sequence advancing or retarding sequentially one chip per clock cycle relative to the reference PN. The operation is simple, efficient, and well suited for hardware implementation, and eliminates the need to perform mask calculations by the microprocessor during search and acquisition of CDMA signals.

Although the present invention and its advantages have been described in detail, it should be understood that various changes, substitutions and alterations can be made herein without departing from the spirit and scope of the invention as defined by the appended claims. For example, although the method is described above as implemented in software, those of ordinary skill in this art will readily appreciate that implementation could be accomplished in hardware, as well.

What is claimed is:

1. An apparatus for providing a reference pseudo-noise ("PN") sequence, and for providing a secondary PN sequence shifted with respect to said reference PN sequence by a number of chips that can be sequentially shifted, comprising a first pseudo-noise sequence generator ("PNSG"), the PNSG generating said reference PN code, having N stages, each stage being at one of two states, and having a feedback loop from the output of the PNSG, the value on the feedback loop being stored in each stage 1, 2, 3, ... N, after being multiplied by a constant associated with the stage, C1, C2, C3, ... CN, respectively, and the result added to the value in the previous stage, with "0" being deemed to be the value in the stage previous to the first stage, and then stored in the stage;

a mask generator/shifter comprising a second PNSG having N stages, wherein said N stages of said second PNSG may be loaded with a shift-and-add mask, $M=m_1, m_2, \ldots, m_{N-1}, m_N$;

a plurality of N logical AND steps, each logical AND step being connected to multiply the states of the corresponding stage of said first PNSG and of said second PNSG;

a plurality of logical XOR steps, connected to add the results of all of said N logical AND steps to provide said secondary PN sequence.

* * * * *